United States Patent [19]

Deinhardt et al.

[11] Patent Number: 5,218,518
[45] Date of Patent: Jun. 8, 1993

[54] RACK MOUNTABLE BOX SHAPED MODULE WITH CONICAL POSITIONING ELEMENTS

[75] Inventors: Günther Deinhardt, Amberg; Reinhard Schirbl, Schwandorf, both of Fed. Rep. of Germany

[73] Assignee: Siemens Aktiengesellschaft, Munich, Fed. Rep. of Germany

[21] Appl. No.: 830,515

[22] Filed: Feb. 3, 1992

Related U.S. Application Data

[63] Continuation of Ser. No. 586,514, Sep. 21, 1990, abandoned.

[30] Foreign Application Priority Data

Sep. 25, 1989 [EP] European Pat. Off. ........ 89117695.0

[51] Int. Cl.⁵ .................. H05K 1/02; H05K 9/00; H05K 7/02
[52] U.S. Cl. .................. 361/395; 361/399; 361/413; 361/424
[58] Field of Search .............. 361/340, 354, 395, 399, 361/413, 415, 424; 174/138 G, 51; 43/224; 439/680, 681; D13/162

[56] References Cited

U.S. PATENT DOCUMENTS

| | | | |
|---|---|---|---|
| D. 309,446 | 7/1990 | Russell | D13/162 |
| D. 309,600 | 7/1990 | Backes | D13/162 |
| 3,631,299 | 12/1971 | Meyer et al. | 361/399 |
| 3,668,476 | 6/1972 | Wrabel et al. | 361/395 X |
| 3,688,635 | 9/1972 | Fegen | 174/138 A |
| 3,895,267 | 7/1975 | Gordon et al. | 361/399 X |
| 4,152,750 | 5/1979 | Bremenour et al. | 361/383 |
| 4,303,296 | 12/1981 | Spaulding | 361/415 X |
| 4,307,927 | 12/1981 | Mollman | 439/681 |
| 4,339,628 | 7/1982 | Marcantonio et al. | 361/424 X |
| 4,579,412 | 4/1986 | Czeschka et al. | 439/680 X |
| 4,598,336 | 7/1986 | Hehl | 439/680 X |
| 4,672,511 | 6/1987 | Meusel et al. | 361/415 |
| 4,688,148 | 8/1987 | Mallory et al. | 361/395 |
| 4,758,928 | 7/1988 | Wierec et al. | 361/415 |
| 4,760,495 | 7/1988 | Till | 361/412 |
| 4,769,741 | 9/1988 | Smith | 361/395 |
| 4,879,434 | 11/1989 | Assel et al. | 361/424 X |
| 4,928,208 | 5/1990 | Volpe et al. | 361/395 |
| 4,991,056 | 2/1991 | Shimizu et al. | 361/395 X |
| 4,998,183 | 3/1991 | Chiang | 361/395 |

FOREIGN PATENT DOCUMENTS

| | | |
|---|---|---|
| 0067757 | 12/1982 | European Pat. Off. |
| 2543695 | 4/1977 | Fed. Rep. of Germany ...... 361/415 |
| 8415458 | 3/1986 | Fed. Rep. of Germany |
| 8903468 | 6/1989 | Fed. Rep. of Germany |
| 08662 | 11/1988 | World Int. Prop. O. |

*Primary Examiner*—Leo P. Picard
*Assistant Examiner*—Michael W. Phillips
*Attorney, Agent, or Firm*—Kenyon & Kenyon

[57] ABSTRACT

A box-shaped module has a design whereby the automated manufacture and assembly of these modules and their components is possible in simple, sequential steps. For this purpose, a housing shell is provided with conical spigots for positioning a printed circuit board and a ground terminal. The latter is able to be locked into place via a projection in a depression of the housing shell. Plug and socket connections and holes which are used for positioning are provided on the printed circuit board at a fixed distance to each other, which serves to guarantee a meeting of the plug and socket connections with the mating terminals while the module is being inserted into a mounting rack.

25 Claims, 6 Drawing Sheets

RACK MOUNTABLE BOX SHAPED MODULE WITH CONICAL POSITIONING ELEMENTS

This application is a continuation of application Ser. No. 07/586,514, filed Sep. 21, 1990, abandoned.

BACKGROUND OF THE INVENTION

The present invention relates generally to box-shaped modules, with printed circuit boards and with ground terminals, for connection to a mounting rack. More particularly, the present invention relates to an improved module that can be automatically assembled.

German Utility Patent 84 15 458 discloses a box-shaped module with printed circuit boards and with ground terminals, that consists of at least one housing shell and a cover, which box-shaped module can be connected to a mounting rack. Plug and socket connections are mounted on the mounting rack towards the terminal side of the module. The manufacture and assembly of the components takes place by a very tedious manner in several manual steps. Contacting the plug and socket connections of the module to mating terminals on the mounting rack requires particular care, so that the terminals are not damaged during repeated insertion of the module onto the mounting rack.

The present invention is directed to the problem of further developing a module with printed circuit boards and ground terminals with improved positioning accuracy necessary to properly mate plug and socket connections of the module to their mating terminals on the mounting rack. The present invention is also directed to the problem of improving the design of the components of the module such that it is possible to automatically assemble the module in simple, sequential steps.

SUMMARY OF THE INVENTION

The present invention solves these problems by designing a module with a printed circuit board with plug and socket connections and a means for positioning the printed circuit board. The plug and socket connections are attached in a predetermined position relative to the printed circuit board positioning means. The housing shell has a means for centering the printed circuit board positioning means that position the printed circuit board and that correspond to the printed circuit board positioning means. Thus, the printed circuit board can be placed on the housing shell and positioned with respect to the printed circuit board positioning means. The housing shell also has a means for positioning the ground terminal, and means for securing the ground terminal to the housing shell. In addition, the housing shell has a bearing element with a matched counterpart on a plastic rack which is part of the mounting rack. The bearing element is located at a predetermined distance from plug and socket connections in the assembled state of the module.

The housing shell has venting lattices on narrow sides which are disposed perpendicularly to the terminal side of the module. Heat generated from operation of the printed circuit board is dissipated via these lattices.

It is advantageous if the printed circuit board positioning means and ground terminal positioning means and the securing means as well as possibly the bearing element, are molded on the housing shell or on the cover, since these parts can be simply and cheaply manufactured as molded parts. An otherwise necessary, time-consuming securing of the printed circuit board and ground terminal positioning means and the securing means is thereby omitted.

A particularly simple design is created if the means for positioning the printed circuit board is designed as printed circuit board centering spigots, and if the corresponding printed circuit board centering means of the printed circuit board are holes. During manufacture of a module by automated means, the printed circuit board is lowered onto the housing shell into the pre-positioned location by means of the printed board centering spigots, which precisely position the printed circuit board over the shell via the holes in the printed circuit board.

The ground terminal positioning means for positioning the ground terminal are designed as guide centering spigots on the inner wall of the housing shell perpendicular from the inner wall, and if one recess, which matches the shape of the ground terminal, is provided in the housing shell, then the ground terminal can be positioned by positioning the guide centering spigot and subsequently lowering it into the recess in a predetermined, laterally immobile position A simple design results in that the printed circuit board centering spigots serve simultaneously as guide centering spigots for centering the ground terminal.

An inadvertent disconnection of the ground terminal opposite to its mounting direction is avoided by designing the anchor as a projection on the ground terminal that engages into a correspondingly formed recess on the housing shell.

The bearing element is designed as whistle-shaped offsets to connect the module mechanically (e.g. by tilting it onto the mounting rack) and electrically via plug and socket connections. By means of this bearing element, the plug and socket connections of the module are brought into a position which opposes the mating terminals of the mounting rack while tilting the module, which facilitates their contacting. The housing shell includes a projection on the terminal side of the module, which is provided at a defined distance to the plug and socket connections of the module, as an additional auxiliary measure to ensure better contact between the plug and socket connections and their mating terminals. This projection permits a more accurate positioning of the module when a protruding spring element, upon which the projection supports itself when the module is tilted, is provided on the slot of the module on the mounting rack at a corresponding distance from the mating terminals In order to avoid disturbing influences on the operation of the module due to external electromagnetic fields, it is advantageous to surround the printed circuit board in the module with a metal shield, which like the ground of the printed circuit board is electrically connected to the ground terminal. Automatic attachment of a first electromagnetic shield to the housing shell is also possible if pressable spigots are provided on the inner wall of the housing shell which position the first electromagnetic shield relative to corresponding bore holes. The electromagnetic shield is secured after positioning by subsequently pressing down the centering spigots.

To completely shield the printed circuit board, a second electromagnetic shield is provided on the side of the printed circuit board which is opposite from the side where the first shield is disposed in the fully assembled state of the module. Then both of the shields are bent-down on the side opposing the terminal side and the bent-down shield surfaces at least partially overlap. By dividing the electromagnetic shield into two parts which overlap each other with their bent-down shield surfaces when the module is assembled, a simple manufacture and assembly of the shield is achieved.

The second shield is secured to the printed circuit board and has knock-outs and two holes in its bent-down shield surface to obtain a good screening effect for a printed circuit board that has front-sided plug connectors. The knock-outs have dimensions that match the metal collars of plug connectors which are mounted and soldered onto the front side of the printed circuit board. The shield is bolted via the holes onto the metal collar. In this manner, a fully effective screening inclusive of plug connectors is achieved on the printed circuit board.

The ground terminal is designed as a hook-shaped ground clip which has a positioning hole that matches the centering spigots, an anchoring hole, and threaded holes by means of which the shields are bolted on so that the ground terminal is positioned and a particularly good electrical connection to the shields is established. By shaping the ground clip like a hook, and by means of the threaded holes, the distance of both shields from each other is bridged and, moreover, the shields are fastened to the ground clip.

The plug and socket have a defined distance from the outer surface of the housing shell on which they are mounted via the printed circuit board, due to their accurate positioning process. The plug and socket connections should always be mounted at the same distance from the outer surface of the module, regardless of the thickness of the printed circuit board, in order to exclude the influence of unavoidable thickness tolerances of the printed circuit boards.

This task is solved in an advantageous manner by locating supporting points on the housing shell on the side located to the inside of the module. Next, one of the two surfaces of the printed circuit board is placed for assembly on the supporting points, which have a defined distance to the outer surface of the housing shell. Thus, the plug and socket connections are secured at a defined distance from the surface upon which they are to be placed.

Moreover, the modules should always have the same width regardless of the thickness tolerance of the printed circuit boards. This is achieved when the housing shell and the cover have surfaces which have a defined distance from the outer surface of the housing shell, and when one surface of the housing shell in the assembled state of the module is placed on a corresponding, opposing surface of the cover.

In some applications, the use of modules with two printed circuit boards is necessary (e.g. when a circuit cannot be realized on a single printed circuit board due to its space requirement). For these applications, the housing shell has printed circuit board centering spigots and surfaces in levels set apart at defined intervals which are parallel to the outer wall of the housing shell. By means of these centering spigots and surfaces, another printed circuit board, in addition to the first printed circuit board, with holes in corresponding places in relation to the first printed circuit board is positioned and fastened, and then the cover is bolted directly onto the housing shell via several surfaces. This specific embodiment also distinguishes itself through the automated assembly of a module with two printed circuit boards.

If the module has an opening on its side opposing its terminal side, then printed circuit boards can also be used which protrude out through the opening. In order to avoid damage to the printed circuit board and other components of the module via the opening, a front shrouded cover is attached to the open side which lies opposite the terminal side of the module. The attachment of the front shrouded cover, which often is difficult due to easy deformability of the thin outer walls, is facilitated by flat teeth that engage the walls of the housing shell and the cover. The flat teeth are located towards the outside on the longitudinal edge of the front shrouded cover.

An additional improvement is that the length of the teeth gradually decreases as one moves from the narrow sides of the front shrouded cover to the center.

An external electrical connection for transmitting input and output signals is possible via a plug connector if the front shrouded cover is notched, and if the recessed front part has a cut-away portion, which allows contact to a plug connector which is soldered onto the printed circuit board.

An advantageous design results in that a cover is provided with dimensions that match the notched space so that this notched part can be covered by the cut-out portion if needed.

If the housing shell and the cover have protruding surfaces on the terminal side of the module which form a hood for the module, then on the one hand, the hood prevents damage to the plug connectors that protrude, which could otherwise be easily damaged. On the other hand, the module is guided by the hood while being tilted onto the mounting rack since the hood can glide along correspondingly arranged surfaces on the module slot of the mounting rack.

The inadvertent connection of a module which does not fit onto a module slot on the mounting rack can be prevented by using a module that has a coding element on the terminal side, and by using a matched counterpart provided on the mounting rack at the appropriate spot.

DETAILED DESCRIPTION

Figure 1:
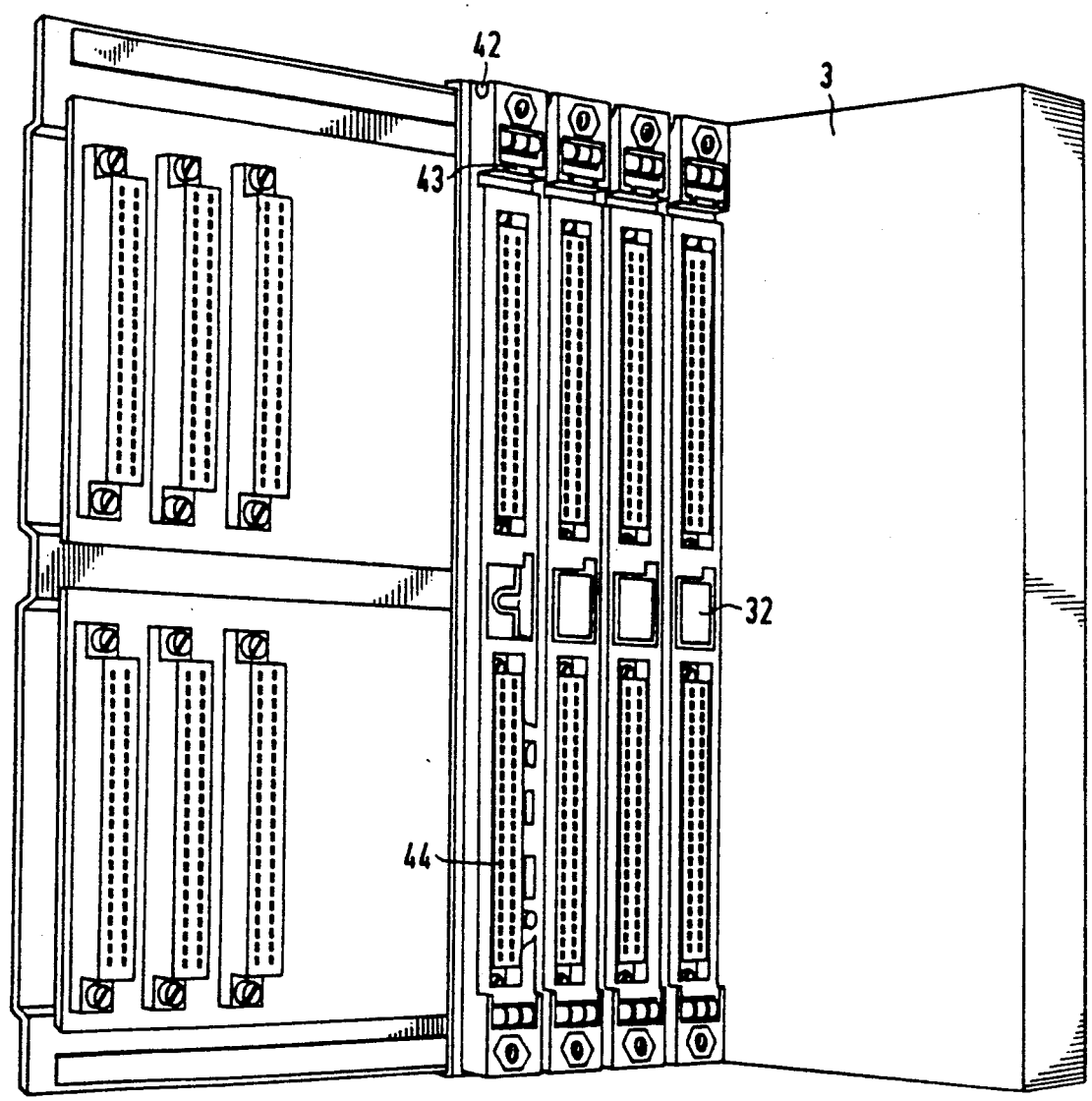
FIG. 1 shows a module constructed according to an embodiment of the present invention that is secured on a mounting rack.

Referring to FIG. 1, a module 3 which is connected to a mounting rack is represented, whereby the necessary electrical connection for exchanging signals with the module 3 takes place via the mating terminals of the mounting rack, which are designed here in the form of female multi-pin connectors 44. The module 3 can be tilted via a pivot recess 42 on the top side of the mounting rack and lifted via a spring element 43.

Figure 2:
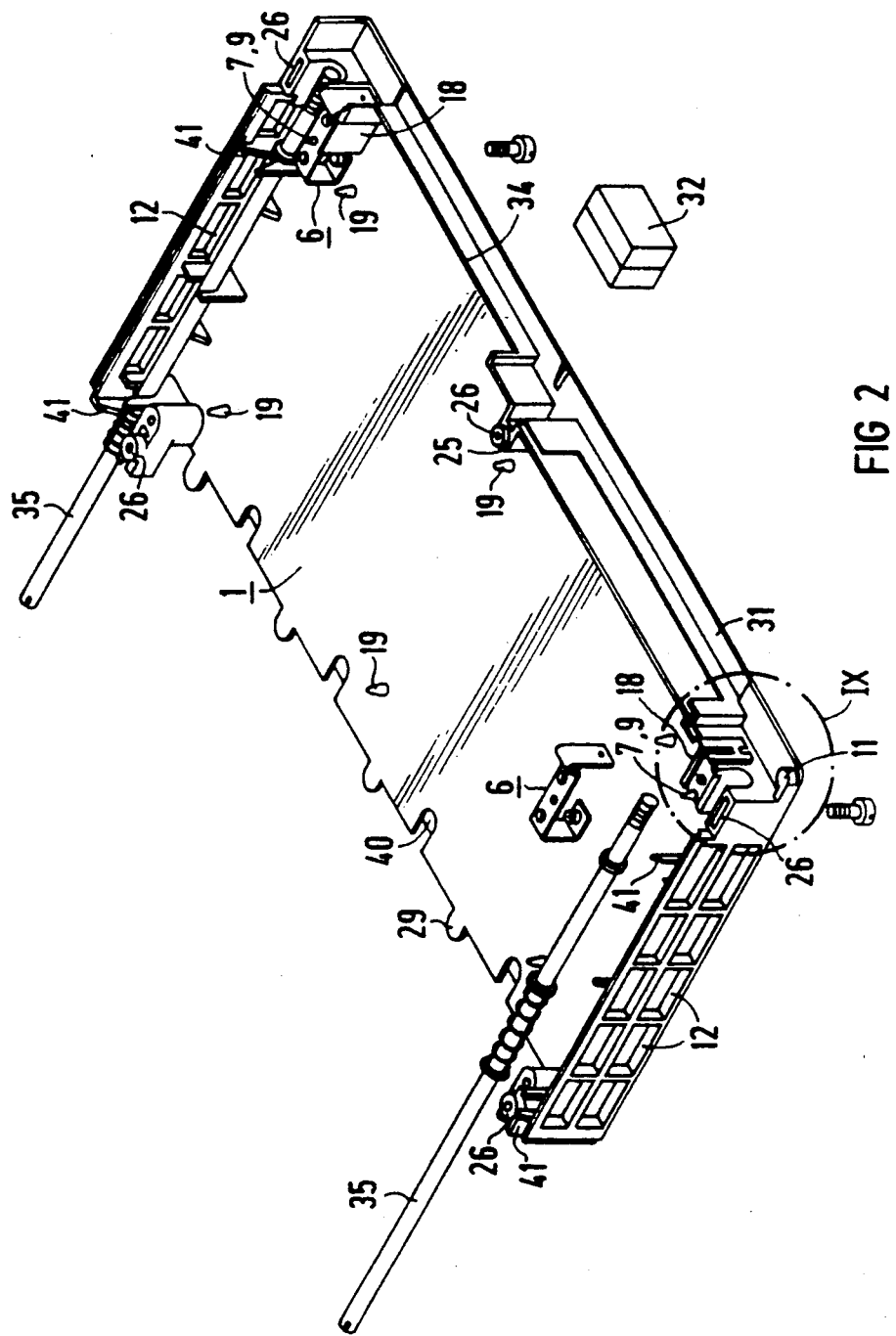
FIG. 2 shows the interior view of a housing shell constructed according to an embodiment of the present invention with a hook-shaped ground clip and threaded bolts.
Figure 3:
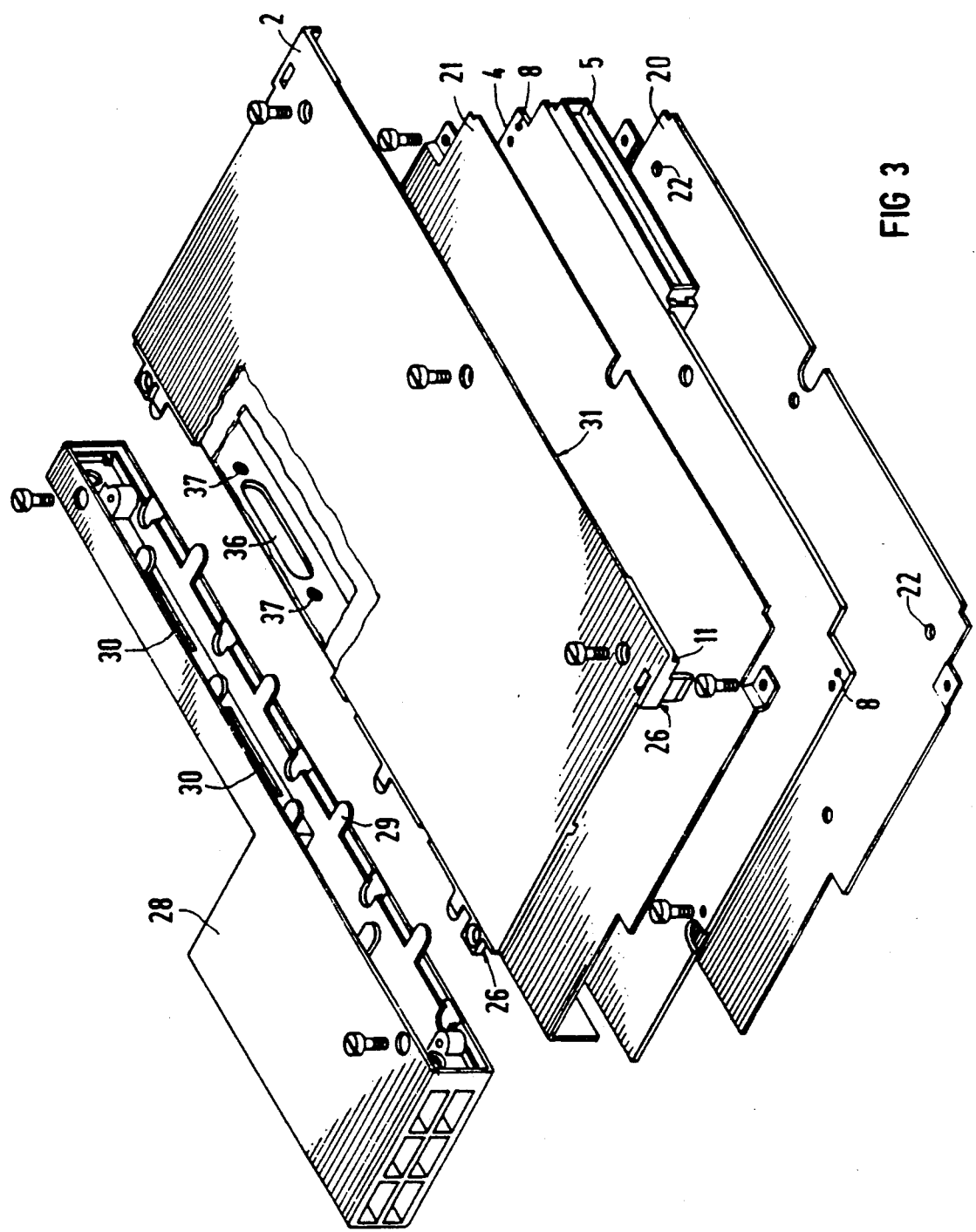
FIG. 3 is an exploded view of parts of the module according to FIG. 1.
Figure 6:
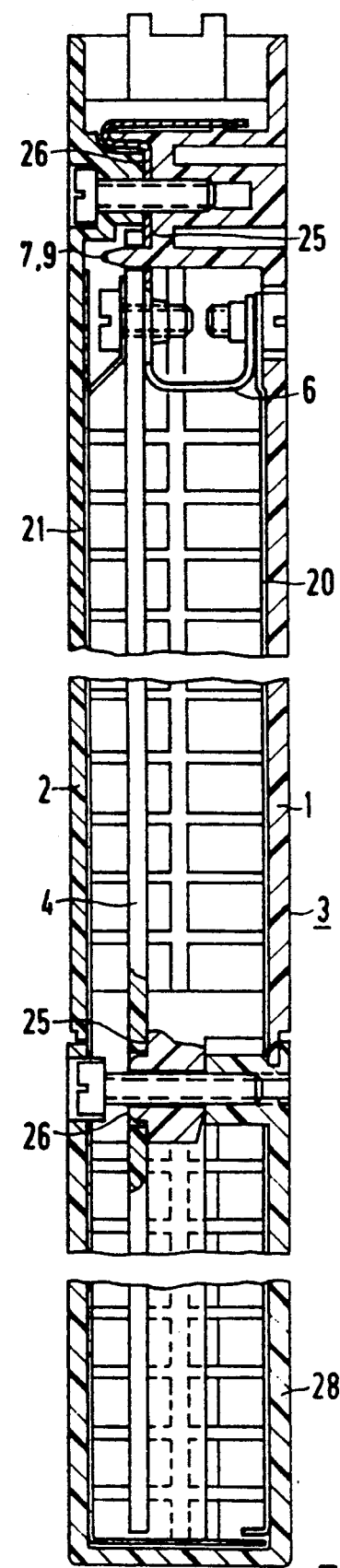
FIG. 6 is a cross section of a module constructed according to an embodiment of the present invention with a printed circuit board.

The module 3 is composed of a housing shell 1 shown in detail in FIG. 2 and a cover 2 illustrated in detail in FIGS. 3,6. FIG. 2 shows the inside of a housing shell 1, which has venting lattices 12 on its narrow sides When module 3 is installed, the heat produced during the operation of module 3 is dissipated via these venting lattices 12. Printed circuit board positioning means, which in this embodiment are pressable spigots 19 as shown in FIG. 2 are provided on the inner wall of the housing shell 1 by means of which e.g. a first shield 20 in FIG. 3, which has corresponding printed circuit board centering means, which in this embodiment are positioning holes 22, can be automatically positioned and can be subsequently secured to the pressable spigots 19 by applying pressure to the shield, thus deforming the pressable spigots.

Figure 9:
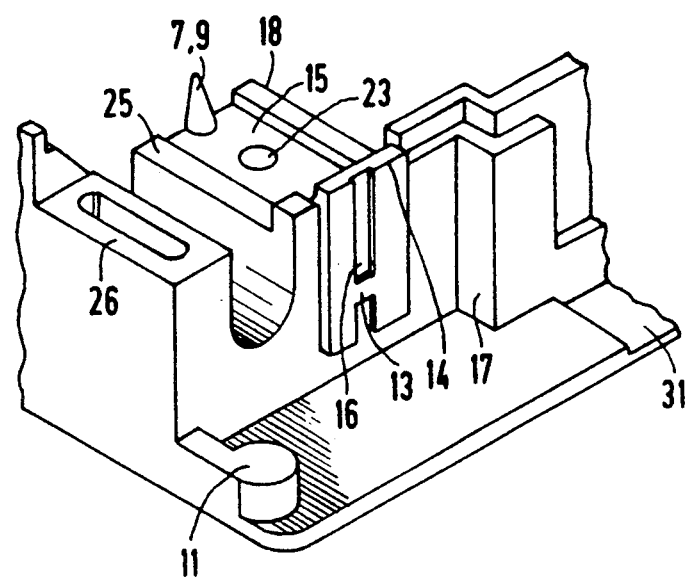
FIG. 9 is an enlargement of the encircled portion IX of FIG. 2.

On the longitudinal side that is designated for later connection to module 3, there are two blocks 18 which could be molded out of plastic. These two blocks 18 secure both the ground terminals, which in this embodiment are hook-shaped ground clips 6, and a printed circuit board 4 illustrated in FIG. 3. As illustrated in FIG. 9 which is an enlarged view of the area IX of FIG. 2, both blocks 18 have a bar-like projection 14 through which the ground clip 6 is thrust, and a groove-like opening 15 parallel to the narrow sides of the housing shell 1. One threaded hole 23 is located in the groove 15 and next to this hole one ground terminal centering means, which in this embodiment is a printed circuit board centering spigot 7,9 protrudes from the opening 15. Towards the terminal side of the blocks 18, a narrow, groove-shaped depression 16 is provided which runs parallel to the short edges of the narrow sides with the venting lattices 12 and which is interrupted by a small crossbar 13.

Across from the blocks 18, a surface 31 projects towards the terminal side which, together with a corresponding surface 31 on the cover 2 of FIG. 3 forms a hood of the module 3. The design in the form of a hood serves the purpose of protecting the plug and socket connections 5 on the terminal side of the module 3 from damage. Additionally, in conjunction with a correspondingly shaped offset on the mounting rack for each module slot, the design in the form of a hood serves the purpose of facilitating the tilting of the module 3 onto the mounting rack. The module 3 is laterally guided over the hood during the tilting process.

Moreover, one whistle-shaped offset 11 is provided on the projecting surfaces 31 of the housing shell 1 and of the cover 2 for tilting the module 3. The module 3 is introduced into and stored in these pivot recesses 42 on the top side of the mounting rack as shown in FIG. 1 while being tilted onto the mounting rack via its whistle-shaped offsets 11. The pivot recesses 42 match the whistle-shaped offsets 11.

Figure 5:
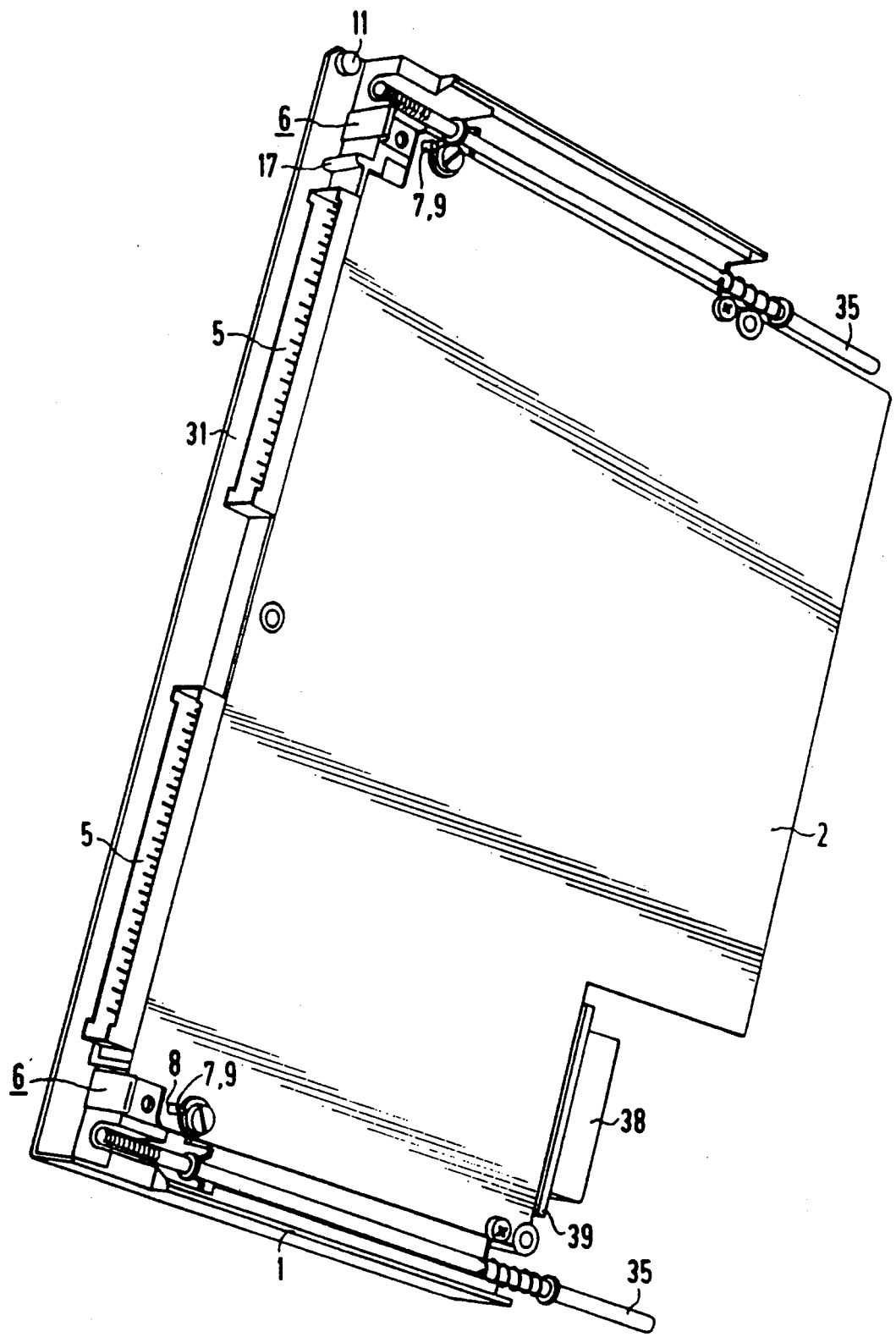
FIG. 5 shows a housing shell with a printed circuit board which is bolted onto it according to the principles of the present invention.

Towards the terminal side, the housing shell 1 has an opening 34 through which the plug and socket connections 5 of the module 3 can protrude. In FIG. 2, only one opening 34 is illustrated, but it is also possible to provide a second opening for additional plug and socket connections 5, as shown in FIG. 3, in the other half of the housing shell 1 if needed. Furthermore, a protrusion 17 shown in FIG. 5 is provided on the terminal side at a designated distance to the printed circuit board centering spigot 7.

Flat teeth 29 illustrated in FIG. 2 projecting to the outside, are pre-molded on the narrow longitudinal edge of the housing shell 1 which is opposite the terminal side. The inner wall on this longitudinal side has toothed, beveled recesses 40.

Figure 4:
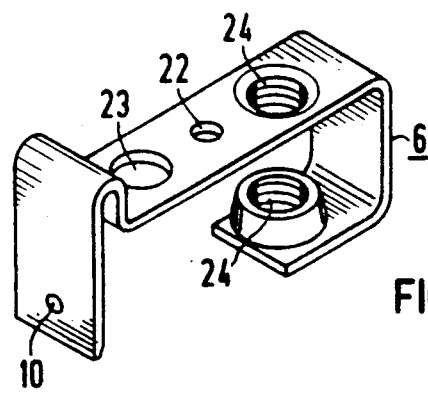
FIG. 4 shows a ground hook-shaped clip constructed according to an embodiment of the present invention.

FIG. 4 shows the ground terminal, which in this embodiment is a hook-shaped ground clip 6, having a positioning hole 22, an anchoring hole 23 as well as two threaded holes 24. The hook-shaped ground clip 6 is shaped such that it is able to be automatically attached via its positioning hole 22 to the aforesaid block 18. The ground terminal centering means, which in this embodiment is a printed circuit board centering spigot 7 engages in the positioning hole 22 for guidance and a securing means, which in this embodiment is a projection 10 on the inside of the hook-shaped ground clip 6 moreover serves as a guide in the groove-shaped depression 16, which projection 10 anchors the hook-shaped ground clip 6 on the crossbar 13.

After attaching the hook-shaped ground clip 6, it is disposed into the groove-shaped opening 15 so that in this manner its lateral displacement is prevented during assembly. After both hook-shaped ground clips 6 have been anchored to the housing shell 1 in the above manner, threaded bolts 35, which serve to secure the module, can be locked into corresponding slots 41 of FIG. 2 by automated means.

The printed circuit board 4 as in FIG. 3 with the already preassembled plug and socket connections 5, and possibly with a second shield 21, can be attached to the housing shell 1. The automatic placement of the printed circuit board is also possible, whereby printed circuit board positioning means, which in this embodiment are holes 8, which match the printed circuit board centering means, which in this embodiment are printed board centering spigots 7, are provided in the printed circuit board 4 for its positioning. The printed circuit board positioning means, e.g. holes 8, and the plug and socket connections 5 are located at a certain distance with respect to each other, whereby a defined spacing of the plug and socket connections 5 is achieved to the protrusion 17 and to the whistle-shaped offsets 11 on the module 3.

By means of this dimensionally accurate assignment, which also accordingly exists between the mating terminals and the pivot recess 42 as well as the spring element 43 on the mounting rack, an accurate mating of the plug and socket connections 5 with the mating terminals is finally guaranteed.

After positioning, the printed circuit board 4, having the second shield 21 secured to it, may be secured to the hook shaped ground clip 6 via one of the two threaded holes 24 on the hook-shaped ground clip 6 as in FIG. 4 (see FIG. 6).

The component side of the printed circuit board 4 faces the inner wall of the housing shell 1, which particularly also applies to the plug and socket connections 5, which sink into the correspondingly shaped opening 34 of the housing shell 1. This is important in order to also achieve a predetermined, lateral spacing of the plug and socket connections 5 from the outer wall of the housing shell 1. Since the printed circuit board 4 rests on the supporting points 25 belonging to the blocks 18, which are also set apart at a defined distance from the outer wall of the housing shell 1, a defined lateral spacing of the plug and socket connections 5 is also established by securing the plug and socket connections 5 to the component side of the printed circuit board 4. This design furnishes the advantage in that unavoidable thickness tolerances of the printed circuit board 4 are insignificant for the accurate positioning of the plug and socket connections 5.

In an exploded view in FIG. 3, the printed circuit, board 4 of the module 3 is visible with the shield 20,21 on both sides as well as the corresponding cover plate 2 and the front shrouded cover 28. The knock-out 36 which matches the dimensions of the metal collars 39 of the plug connectors 38 (FIG. 5), and the corresponding holes 37 are shown in FIG. 3. Here, the sandwich type construction which permits an automated layer stacking is clearly recognizable. The front shrouded cover 28 is mounted by way of teeth 29.

In FIG. 6 an assembled module is illustrated which consists of the housing shell 1, the hook-shaped ground clip 6, the first shield 20 of the printed circuit board 4 having a second installed shield 21 as well as the cover 2 and a front shrouded cover 28. From this it becomes clear that the housing shell 1 and the cover 2 have surfaces 26 which lie directly on top of each other in the assembled state of the module 3 and which, through their defined spacing from the respective outer walls, also result in a specific width of the module 3. In this manner, the modular width results regardless of the printed circuit board 4 thickness and its possible thickness tolerances.

For the case that the housing shell 1 and the cover 2 having an opening towards the front side, the module 3 can be provided with a printed circuit board 4 which protrudes through the opening. In this manner an adaptation to required printed circuit board sizes is possible. The variation in printed circuit board sizes is required according to the circumference of the circuit to be realized. The front shrouded cover 28 serves to cover the opening which can also be designed to adapt to the dimensions of the printed circuit board 4.

Figure 7:
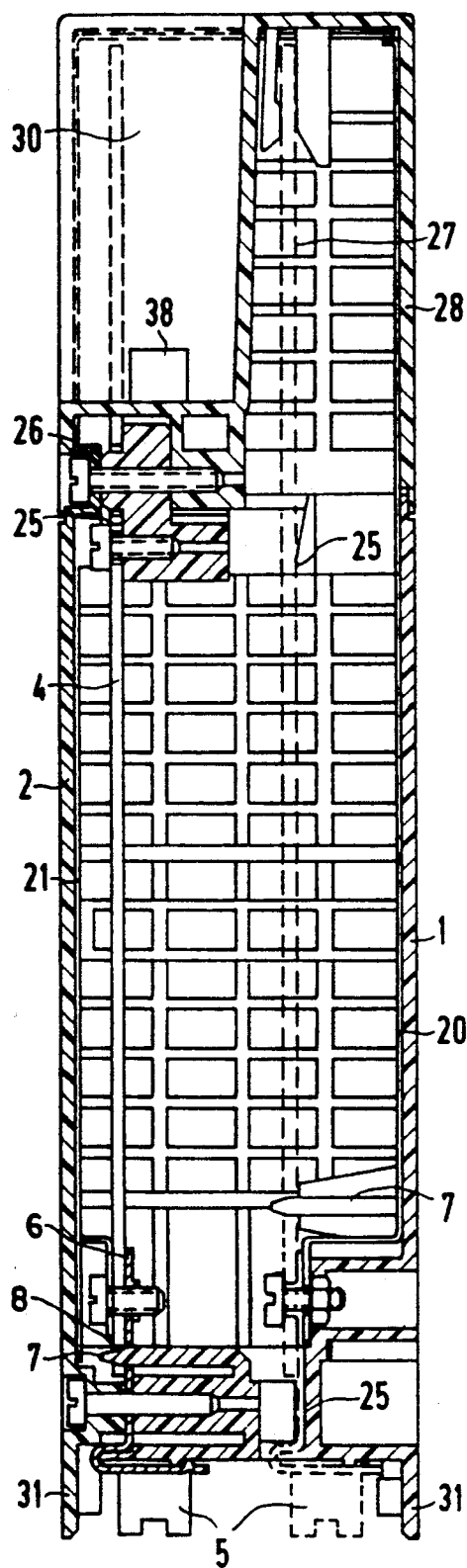
FIG. 7 is a cross section of a module constructed according to an embodiment of the present invention with two printed circuit boards.

This front shrouded cover 28 can be notched, for example when the printed circuit board bears on its front side a plug connector 38 which is bolted onto the shield 21 via a metal collar and by way of which an external exchange of signals is supposed to take place. This is represented in FIG. 7 for a dual module with two printed circuit boards 4, 27. For this purpose, a cut-away portion 30 illustrated in FIG. 8 for connecting the plug connector 38 is present in the notched part on the front shrouded cover 28.

The front shrouded cover 28 shown in FIG. 3 also has flat teeth 29 towards the outside on its longitudinal edges as are represented for the housing shell 1 in FIG. 2. To secure the front shrouded cover 28, these teeth 29 engage with the corresponding beveled recesses 40 on the inner wall of the housing shell 1. Thus, the attachment of the front shrouded cover 28 is facilitated, which is often difficult due to the easy deformability of the thin outer walls.

Figure 8:
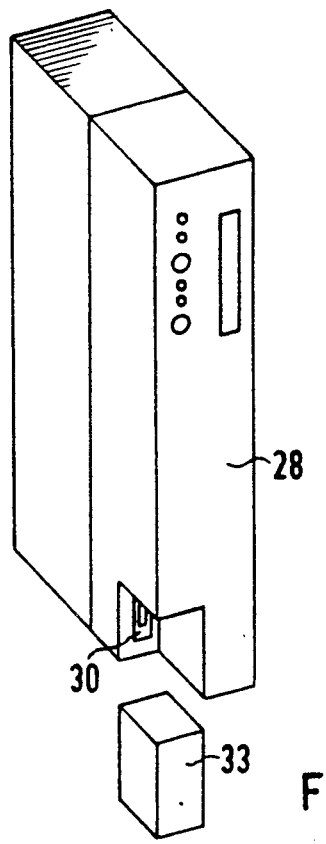
FIG. 8 shows a doubly wide module with a cut-away portion on its front shrouded cover constructed according to the principles of the present invention.

After attaching the mating plug connector, and in case that no connections are needed to the plug connector 38 from outside, the cut-away portion 30 in the notched part of the front shrouded cover 28 can be covered by an additional outer casing 33, as shown in FIG. 8.

A coding element 32 is attached to the terminal side of the module 3 shown in FIG. 2, which only permits the connection of this module 3 to a module slot of the mounting rack which has a correspondingly matched counterpart. In this manner it is possible to prevent the modules 3 from being inadvertently inserted onto the incorrect module slots of the mounting rack.

FIG. 7 shows a module with two printed circuit boards 4, 27 in cross section which are mostly similar in the described design to a circuit board 4; however, the shape of the ground clip 6 is different, i.e. the ground clip has essentially an L-shape rather than the hook shaped shown in FIG. 4. By means of defined spacing of the printed board centering spigots 7 and surfaces 26 to the housing shell 1, both of the printed circuit boards 4, 27 can also be positioned and fastened into positioning means, e.g. holes 8 which are provided at the appropriate spots.

The accurate positioning of the plug and socket connections 5 is achieved here while avoiding thickness tolerances of the printed circuit boards 4 in the same manner as in the module 3 with only one printed circuit board 4. In turn, the housing shell 1 is also directly bolted to the cover 2 via corresponding surfaces 26 which lie on top of each other.

What is claimed is:

1. A box-shaped module for connecting to a mounting rack, which has plug and socket connections and a recess located at a predetermined position relative to the plug and socket connections, comprising:

a) a cover;
b) a housing shell having a terminal side, a base and two narrow sides, said housing shell being attached to said cover;
c) a printed circuit board having plug and socket connections connectable with the plug and socket connections of the mounting rack, said printed circuit board being disposed between said cover and said housing shell and said printed circuit board including positioning holes;
d) a plurality of first conical elements, said plurality of first conical elements engaging said positioning holes of said printed circuit board thereby automatically self-centering said printed circuit board such that said plug and socket connections of said printed circuit board are accurately positioned within said housing shell;
e) a plurality of second conical elements;
f) a ground terminal disposed on said housing shell, said ground terminal having a positioning hole, whereby one of said plurality of second conical elements engages said positioning hole of said ground terminal such that said ground terminal is accurately positioned within said housing shell;
g) means for securing said ground terminal to said housing shell, said means for securing being disposed on said housing shell; and
a bearing element matching the recess on the mounting rack, and being disposed on said base of said housing shell, whereby said bearing element fits into the recess when said box-shaped module is tilted during insertion into the mounting rack thus accurately positioning said plug and socket connections of said printed circuit board with respect to the plug and socket connections of the mounting rack.

2. A box-shaped module for connecting to a mounting rack, which has plug and socket connections and a recess located at a predetermined position relative to the plug and socket connections, comprising:
   a) a cover;
   b) a housing shell having a terminal side, a base and two narrow sides, said housing shell being attached to said cover;
   c) a printed circuit board having plug and socket connections connectable with the plug and socket connections of the mounting rack, said printed circuit board being disposed between said cover and said housing shell and said printed circuit board including positioning holes;
   d) a plurality of first conical elements, said plurality of first conical elements engaging said positioning holes of said printed circuit board thereby automatically self-centering said printed circuit board such that said plug and socket connections of said printed circuit board are accurately positioned within said housing shell;
   e) a ground terminal disposed on said housing shell, said ground terminal having a positioning hole, whereby one of said plurality of first conical elements engages said positioning hole of said ground terminal such that said ground terminal is accurately positioned within said housing shell;
   f) means for securing said ground terminal to said housing shell, said means for securing being disposed on said housing shell; and
   g) a bearing element matching the recess on the mounting rack, and being disposed on said base of said housing shell, whereby said bearing element fits into the recess when said box-shaped module is tilted during insertion into the mounting rack thus accurately positioning said plug and socket connections of said printed circuit board with respect to the plug and socket connections of the mounting rack.

3. The module according to claim 2 further comprising:
   h) first means for shielding said printed circuit board, said first means for shielding including positioning holes,
wherein said housing shell includes a second plurality of conical elements, said second plurality of conical elements engaging the positioning holes of said first means for shielding whereby said first means for shielding is centered on said housing shell.

4. The module according to claim 3, wherein said bearing element is integral with said housing shell.

5. The module according to claim 2, wherein said bearing element is integral with said housing shell.

6. The module according to claim 2, wherein said first plurality of conical elements comprises a plurality of printed circuit board centering spigots disposed on said base.

7. The module according to claim 2, wherein said ground terminal includes a projection, and said means for securing forms a a depression into which said projection fits such that said projection locks into said depression.

8. The module according to claim 2, wherein said bearing element comprises a whistle-shaped offset.

9. The module according to claim 8, wherein said housing shell further comprises a protrusion being disposed on said terminal side of the module, said protrusion being disposed at a predetermined lateral spacing from said plug and socket connections of said printed circuit board.

10. The module according to claim 2, further comprising a metal sheet being disposed between said housing shell and said printed circuit board, said metal sheet being coupled to said ground terminal, wherein said printed circuit board further comprises a ground coupled to said ground terminal.

11. The module according to claim 2, further comprising a means for shielding said printed circuit board, said first means for shielding being disposed between said housing shell and said printed circuit board and having a plurality of positioning holes, wherein said housing shell further comprises a plurality of pressable spigots being disposed on said base, said plurality of pressable spigots engaging said positioning holes of said first means for shielding thereby positioning said first means for shielding.

12. The module according to claim 11, further comprising a second means for shielding said printed circuit board, said second means for shielding being disposed between said cover and said printed circuit board, and having a first bent-down surface opposite said terminal side of said housing shell, wherein:
   a) said first means for shielding further comprises a second bent-down surface partially overlapping said first bent-down surface; and
   b) said printed circuit board further comprises a component side, which faces away from said second shield when said box-shaped module is completely assembled.

13. The module according to claim 12, wherein:
   a) said second means for shielding further comprises a knockout and a plurality of plug holes, said plurality of plug holes being disposed in said second bent-down surface, and said knockout having a predetermined dimension;
   b) said printed circuit board further comprises a front side opposite said terminal side, and a plug connector having a metal collar mounted and soldered onto said front side;
   c) said predetermined dimension corresponds to said metal collar; and
   d) said second means for shielding is bolted onto said metal collar via said plurality of plug holes.

14. The module according to claim 2, wherein said ground terminal comprises a hook-shaped ground clip, said hook-shaped ground clip having two threaded holes and a projection, said projection being disposed on said hook-shaped ground clip, said means for securing forming a depression which accepts said projection such that said projection locks into said depression, and said two threaded holes allow fastening of a first and a second means for shielding to said hook-shaped ground clip.

15. The module according to claim 2, wherein said housing shell further comprises an open side opposing said terminal side.

16. The module according to claim 15, further comprising a front shrouded cover, wherein said front shrouded cover is attached to said open side.

17. The module according to claim 16, wherein:
   a) said housing shell further comprises a first plurality of recesses;
   b) said cover further comprises a second plurality of recesses; and c) said front shrouded cover further comprises a plurality of flat teeth which engages said first and second plurality of recesses.

18. The module according to claim 17, wherein said first and second plurality of teeth gradually increase in length from a center of said front shrouded cover to an outside of said front shrouded cover.

19. The module according to claim 17, further comprising a plug connector soldered onto said printed circuit board, wherein said front shrouded cover further comprises a notched space and a recessed front portion, said recessed front portion having a cut-away portion allowing access for contact to said plug connector.

20. The module according to claim 19, further comprising an outer casing having dimensions matching the notched space.

21. The module according to claim 2, wherein said housing shell further comprises a first projecting surface and said cover further comprises a second projecting surface wherein said first projecting surface and said second projecting surface form a hood towards said terminal side.

22. The module according to claim 2, further comprising a coding element being disposed on said terminal side, said coding element for matching a second counterpart located at an appropriate spot on the mounting rack.

23. The module according to claim 2, further comprising a threaded bolt for anchoring the module to the mounting rack.

24. The module according to claim 2, wherein said housing shell further comprises a first supporting surface being disposed at a predetermined height from an outside surface of said base, said cover further comprises a second supporting surface resting on said first supporting surface, said second supporting surface being disposed at a second predetermined height from an outside surface of said cover, such that said module has a predetermined width.

25. The module according to claim 24, wherein said housing shell further comprises a supporting point supporting said printed circuit board, said supporting point having a defined spacing to said base, so that said plug and socket connections of the printed circuit board are located at a precise distance from said base and cover, and said module has said predetermined width independent of any printed circuit board tolerances.

* * * * *